United States Patent
Sakai et al.

(10) Patent No.: US 9,526,176 B2
(45) Date of Patent: Dec. 20, 2016

(54) COMPONENT-EMBEDDED RESIN SUBSTRATE

(71) Applicant: Murata Manufacturing Co., Ltd., Kyoto-fu (JP)

(72) Inventors: Norio Sakai, Kyoto-fu (JP); Yoshihito Otsubo, Kyoto-fu (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 122 days.

(21) Appl. No.: 14/246,682

(22) Filed: Apr. 7, 2014

(65) Prior Publication Data

US 2014/0218884 A1 Aug. 7, 2014

Related U.S. Application Data

(63) Continuation of application No. PCT/JP2012/073322, filed on Sep. 12, 2012.

(30) Foreign Application Priority Data

Oct. 14, 2011 (JP) .................. 2011-226960

(51) Int. Cl.
*H05K 1/18* (2006.01)
*H01L 23/498* (2006.01)
(Continued)

(52) U.S. Cl.
CPC ......... *H05K 1/183* (2013.01); *H01L 23/49822* (2013.01); *H01L 23/50* (2013.01);
(Continued)

(58) Field of Classification Search
CPC .......................................... H05K 1/185–1/188
See application file for complete search history.

(56) References Cited

U.S. PATENT DOCUMENTS 5,928,526 A * 7/1999 Morley ............. H01L 21/02035
216/17
6,501,664 B1 * 12/2002 Krieger ................ H05K 1/0231
257/724
(Continued)

FOREIGN PATENT DOCUMENTS

CN 1551719 A 12/2004
JP 11330656 A * 11/1999
(Continued)

OTHER PUBLICATIONS

International Search Report for Application No. PCT/JP2012/073322 dated Oct. 23, 2012.
(Continued)

*Primary Examiner* — Jeremy C Norris
*Assistant Examiner* — Nathan Milakovich
(74) *Attorney, Agent, or Firm* — Pearne & Gordon LLP

(57) ABSTRACT

A component-embedded resin substrate includes a resin structure including a plurality of laminated resin layers and having an end surface surrounding an outer periphery of the resin layers and a plurality of embedded components arranged as embedded in the resin structure. The plurality of embedded components include a first embedded component and a second embedded component. When viewed in a planar view, the first embedded component has a first outer side extending along a portion of an end surface 5 closest to the first embedded component. When viewed in a planar view, the second embedded component has a second outer side extending along a portion of the end surface closest to the second embedded component. When viewed in a planar view, the outer side is oblique to the second outer side.

4 Claims, 15 Drawing Sheets

(51) Int. Cl.
*H01L 23/50* (2006.01)
*H01L 23/00* (2006.01)
H05K 3/46 (2006.01)
H05K 1/02 (2006.01)
H05K 1/03 (2006.01)

(52) U.S. Cl.
CPC ............. *H01L 24/95* (2013.01); *H05K 1/186* (2013.01); *H05K 3/4697* (2013.01); *H01L 2224/16225* (2013.01); *H01L 2924/12042* (2013.01); *H01L 2924/19105* (2013.01); *H05K 1/0298* (2013.01); *H05K 1/0306* (2013.01); *H05K 3/4614* (2013.01); *H05K 2201/0195* (2013.01); *H05K 2201/09027* (2013.01); *H05K 2201/10507* (2013.01); *H05K 2201/10636* (2013.01); *Y02P 70/611* (2015.11)

(56) References Cited

U.S. PATENT DOCUMENTS

| | | | | |
|---|---|---|---|---|
| 6,900,978 | B2* | 5/2005 | Shimizu | H01G 4/38 361/328 |
| 6,992,374 | B1* | 1/2006 | Yang | H05K 1/0231 257/678 |
| 7,287,321 | B2* | 10/2007 | Takeuchi | H05K 1/186 174/260 |
| 7,656,677 | B2* | 2/2010 | Ogawa | H01L 23/5383 174/260 |
| 7,709,941 | B2* | 5/2010 | Imaoka | H01L 21/565 257/685 |
| 8,564,966 | B2* | 10/2013 | Kitagawa | H05K 1/0231 361/306.2 |
| 2004/0226744 | A1 | 11/2004 | Asahi et al. | |
| 2006/0102703 | A1* | 5/2006 | Akhtar | B23K 37/0408 228/260 |
| 2008/0174982 | A1 | 7/2008 | Miyamoto et al. | |
| 2013/0182401 | A1* | 7/2013 | Furutani | H05K 1/0296 361/782 |
| 2014/0116767 | A1* | 5/2014 | Sato | H05K 1/185 174/260 |
| 2014/0226288 | A1* | 8/2014 | Otsubo | H05K 1/185 361/748 |
| 2014/0321076 | A1* | 10/2014 | Sakai | H05K 1/0278 361/750 |
| 2015/0085455 | A1* | 3/2015 | Kim | H05K 1/186 361/761 |

FOREIGN PATENT DOCUMENTS

| | | | |
|---|---|---|---|
| JP | 2005-005692 A | 1/2005 | |
| JP | 2005-197354 A | 7/2005 | |
| JP | 2006-073763 A | 3/2006 | |
| JP | 2008-182396 A | 8/2008 | |
| JP | 2008-211127 A | 9/2008 | |
| JP | 2010-016107 A | 1/2010 | |
| JP | WO 2013002035 A1 * | 1/2013 | ............. H05K 1/186 |

OTHER PUBLICATIONS

Written Opinion of the International Searching Authority for Application No. PCT/JP2012/073322 dated Oct. 23, 2012.

* cited by examiner

COMPONENT-EMBEDDED RESIN SUBSTRATE

BACKGROUND OF THE INVENTION

Field of the Invention

The present invention relates to a component-embedded resin substrate.

Description of the Related Art

FIG. 31 shows one example of a component-embedded resin substrate based on the conventional art. In this example, in the inside of a component-embedded resin substrate 901, a resin layer 2 serving as an insulating layer surrounds an outer periphery of an embedded component 3. Component-embedded resin substrate 901 contains a plurality of via conductors 6 and a plurality of conductor patterns 7. As shown in FIG. 32, embedded component 3 is in a parallelepiped shape and has electrodes 3a, 3b at respective opposing end portions. As shown in FIG. 31, via conductors 6n are connected to electrodes 3a, 3b of embedded component 3, respectively.

Japanese Patent Laying-Open No. 2006-73763 (PTD 1) describes one example of a method of manufacturing a component-embedded resin substrate based on the conventional art. According to the invention described in PTD 1, a resin film in which a through hole for insertion of a chip-like embedded component is formed is stacked, and an embedded component is inserted in a recess portion formed by a series of through holes. Six protrusions are formed on an inner surface of this recess portion, and a distance Wt between tip ends of the protrusions opposed to each other is set to be smaller than an outer dimension W2 of the embedded component. In inserting an embedded component in a recess portion, the embedded component is pressed in while tip ends of these protrusions are collapsed. According to the invention described in PTD 1, after the embedded component is pressed in the recess portion, a provisional adhesion step is performed and thereafter the step of applying pressure to this stack is further performed while the stack is heated. Thus, the resin films are press-bonded, and consequently, a multi-layered substrate is obtained.

PTD 1: Japanese Patent Laying-Open No. 2006-73763

BRIEF SUMMARY OF THE INVENTION

Though protrusions are provided on the inner surface of the recess portion for accommodating an embedded component in PTD 1, regardless of the presence or absence of such protrusions, in order to reliably arrange an embedded component in the recess portion, the recess portion is usually provided to have a sufficient size larger than an outer geometry of the embedded component. FIGS. 33 and 34 show in a cross-sectional view and in a plan view respectively, a state that an embedded component is arranged in such a recess portion. Embedded component 3 is arranged in the recess portion. Since the recess portion is greater than embedded component 3, a gap 9 is created to surround the outer periphery of embedded component 3. In the example shown in FIGS. 33 and 34, no protrusion is provided on the inner surface of the recess portion.

By performing the step of applying pressure to the stack while the stack is heated, that is, the press-bonding step, a phenomenon called "resin flow" or "resin flux" takes place in the stack, which means that a resin which is a material for a resin sheet deforms under the influence of externally applied pressure and it flows in the inside of the stack. It is expected that, owing to this resin flow, the resin flows into the gap and the gap is completely filled with the resin.

On the other hand, an outer geometry of the component-embedded resin substrate is not limited to a rectangular shape and other shapes are also acceptable. Component-embedded resin substrates having an outer geometry other than a rectangle in a planar view are hereinafter referred to as a "substrate of variant shape." In the substrate of variant shape, in particular, arrangement of an embedded component gives rise to a problem. Depending on a position of arrangement, what is called θ rotation or position displacement of an embedded component takes place, and it is possible that electrical connection between the embedded component and an electrode cannot properly be established. Here, "θ rotation" means revolution of an embedded component while it remains at the same position. "Position displacement" means displacement of a position itself of an embedded component.

Then, an object of the present invention is to provide a component-embedded resin substrate in which occurrence of what is called θ rotation or position displacement of an embedded component in the press-bonding step can be suppressed in a substrate of variant shape.

In order to achieve the object above, a component-embedded resin substrate based on the present invention includes a resin structure including a plurality of laminated resin layers and having an end surface surrounding an outer periphery of the resin layers and a plurality of embedded components arranged as embedded in the resin structure, the plurality of embedded components include a first embedded component and a second embedded component, the first embedded component has a first outer side extending along a portion of the end surface closest to the first embedded component when viewed in a planar view, the second embedded component has a second outer side extending along a portion of the end surface closest to the second embedded component when viewed in a planar view, and the first outer side is oblique to the second outer side when viewed in a planar view.

According to the present invention, in spite of being a component-embedded resin substrate which is a substrate of variant shape, resin flow tends to be uniform not only between a first embedded component and an end surface but also between a second embedded component and the end surface, and occurrence of θ rotation or position displacement of an embedded component can be suppressed.

DETAILED DESCRIPTION OF THE INVENTION (First Embodiment)

Figure 1:
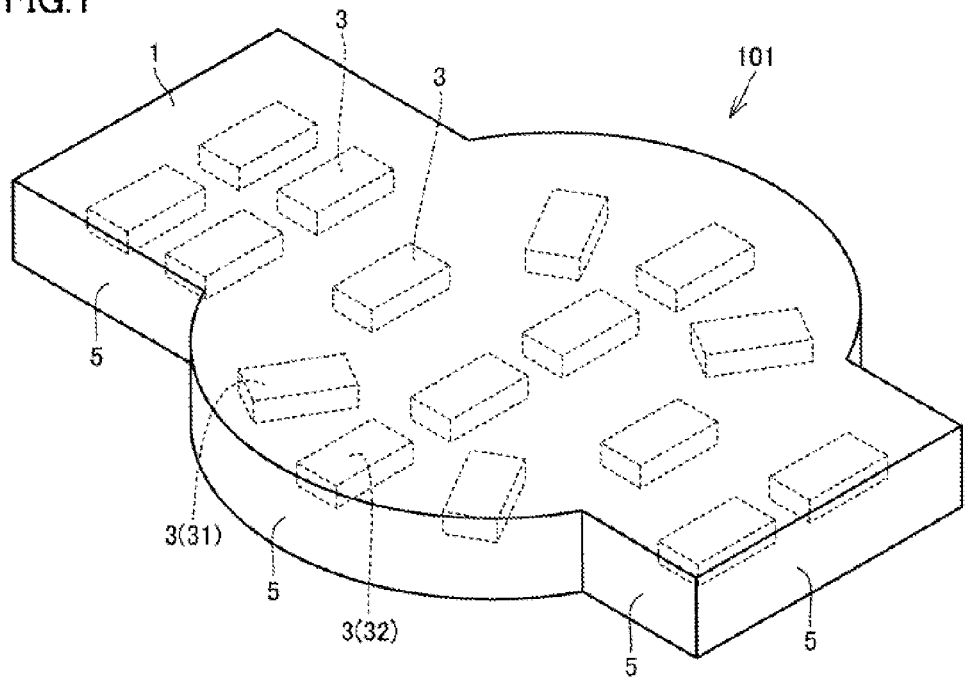
FIG. 1 is a perspective view of a component-embedded resin substrate in a first embodiment based on the present invention.
Figure 2:
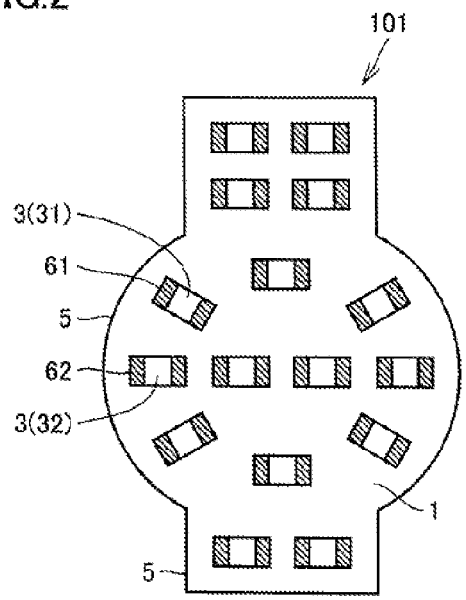
FIG. 2 is a plan view of the component-embedded resin substrate in the first embodiment based on the present invention.

A component-embedded resin substrate in a first embodiment based on the present invention will be described with reference to FIGS. 1 and 2. Since embedded component 3 is hidden in a resin structure 1 in FIG. 1, any embedded component 3 is drawn with a dashed line. Though resin structure 1 may have already been integrated, it originally includes a plurality of laminated resin layers. FIG. 2 shows a component-embedded resin substrate 101 as seen through in a planar view for description of positional relation of embedded components 3. Therefore, in FIG. 2, embedded component 3 hidden in resin structure 1 is also drawn with a solid line instead of a dashed line. FIGS. 1 and 2 do not show a conductor pattern and a via conductor arranged on a surface or in the inside of resin structure 1, which is also the case with a perspective plan view below.

As shown in FIG. 1, component-embedded resin substrate 101 in the present embodiment includes resin structure 1 including a plurality of laminated resin layers and having an end surface 5 surrounding an outer periphery of the resin layers and a plurality of embedded components 3 arranged as embedded in resin structure 1. The plurality of embedded components 3 include a first embedded component 31 and a second embedded component 32. As shown in FIG. 2, first embedded component 31 has a first outer side 61 extending along a portion of end surface 5 closest to first embedded component 31 when viewed in a planar view, second embedded component 32 has a second outer side 62 extending along a portion of end surface 5 closest to second embedded component 32 when viewed in a planar view, and first outer side 61 is oblique to second outer side 62 when viewed in a planar view. "Oblique" herein means that sides are neither in parallel nor perpendicular to each other. Though first outer side 61 of first embedded component 31 is oblique to second outer side 62 of second embedded component 32, it is inextricably associated with the fact that end surfaces 5 extending along a portion of first outer side 61 and second outer side 62 respectively are oblique to each other. Namely, component-embedded resin substrate 101 is a substrate of variant shape.

The inventors have considered θ rotation or position displacement which takes place in connection with embedded component 3 as follows.

Figure 3:
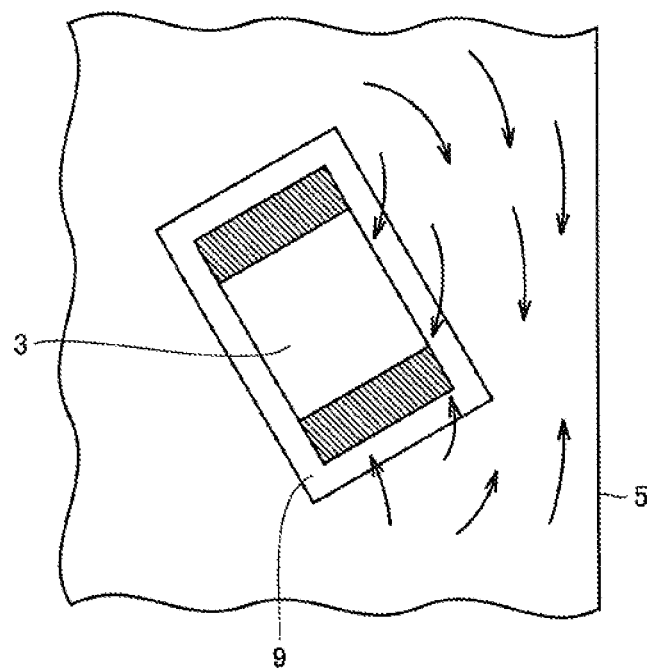
FIG. 3 is a diagram illustrating a manner of resin flow in a periphery in a first example of an embedded component arranged at a position close to an end surface.

It is expected that, in the inside of a component-embedded resin substrate, a gap around embedded component 3 is filled with resin flow during press-bonding, however, in the vicinity of the end surface even in the inside of the component-embedded resin substrate, an amount of resin which exists therearound is limited. Therefore, if resin flow occurs during press-bonding, resin flow itself may become non-uniform. In particular, in a case that embedded component 3 is arranged not in parallel to end surface 5, for example, as shown in FIG. 3, a distance between end surface 5 and embedded component 3 is varied, and hence resin flow which takes place here becomes non-uniform and θ rotation or position displacement of embedded component 3 more likely occurs.

In contrast, though component-embedded resin substrate 1 in the present embodiment is a substrate of variant shape, first embedded component 31 has first outer side 61 extending along a portion of end surface 5 closest to first embedded component 31 when viewed in a planar view and second embedded component 32 has second outer side 62 extending along a portion of end surface 5 closest to second embedded component 32 when viewed in a planar view. Therefore, resin flow tends to be uniform not only between first embedded component 31 and end surface 5 but also between second embedded component 32 and end surface 5, and thus occurrence of θ rotation or position displacement of embedded component 3 can be suppressed.

Figure 4:
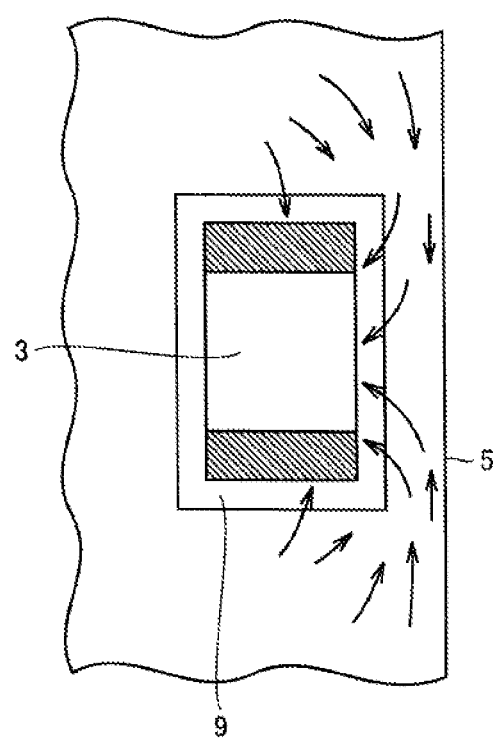
FIG. 4 is a diagram illustrating a manner of resin flow in a periphery in a second example of an embedded component arranged at a position close to an end surface.
Figure 5:
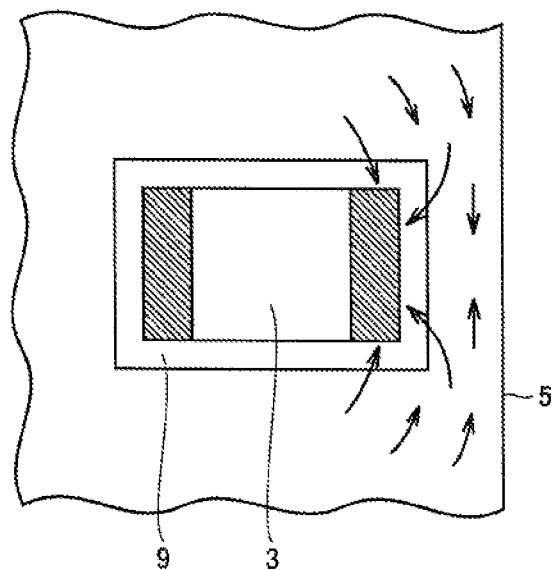
FIG. 5 is a diagram illustrating a manner of resin flow in a periphery in a third example of an embedded component arranged at a position close to an end surface.

It is noted that, preferably, first embedded component 31 and second embedded component 32 are each in a rectangular shape having a long side and a short side when viewed in a planar view, and first outer side 61 is a short side of first embedded component 31 and second outer side 62 is a short side of second embedded component 32. The example shown in FIGS. 1 and 2 is constructed to satisfy this condition. For example, as shown in FIG. 4, in a case that there is rectangular embedded component 3 when viewed in a planar view and a long side of this embedded component 3 is arranged to extend along the closest end surface, a distance by which a resin should go around is long and such a situation that a gap is not sufficiently filled likely occurs. As shown in FIG. 5, however, in a case that a short side of embedded component 3 is arranged to extend along the closest end surface, a distance by which a resin should go around is short, and hence such a situation that a gap is not sufficiently filled less likely occurs, which is preferred.

(Variation)

Some variations of the component-embedded resin substrate shown in the first embodiment will be shown below.

Figure 6:
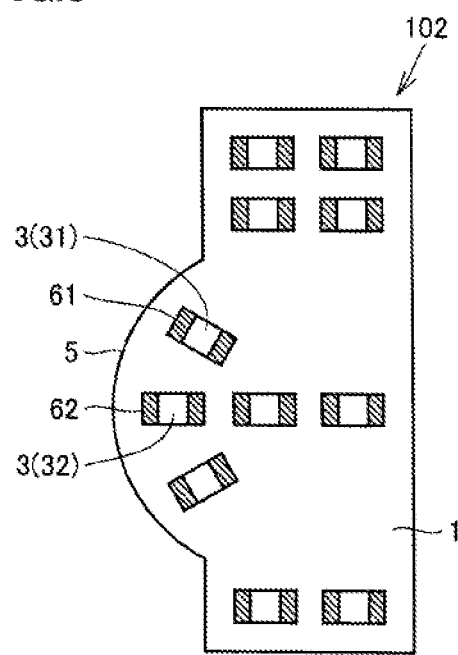
FIG. 6 is a plan view of another example of a component-embedded resin substrate in the first embodiment based on the present invention.

A component-embedded resin substrate to which the present invention is applied may be a component-embedded resin substrate 102 as shown in FIG. 6. In component-embedded resin substrate 102, a part of one long side is in an arc shape in a projecting manner, while the other long side extends linearly.

Figure 7:
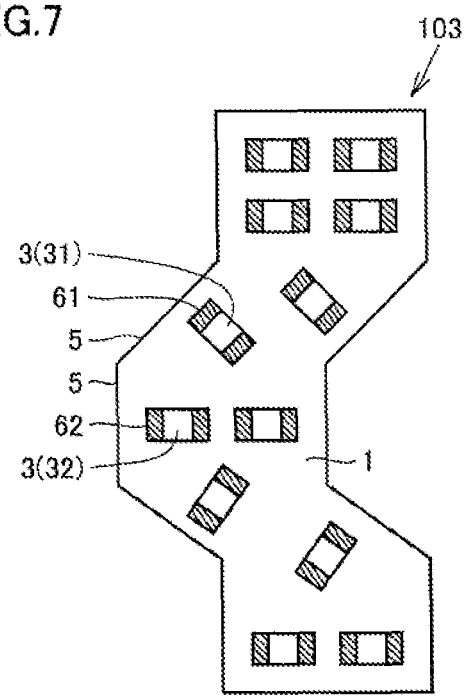
FIG. 7 is a plan view of a first variation of the component-embedded resin substrate in the first embodiment based on the present invention.

A component-embedded resin substrate to which the present invention is applied may be a component-embedded resin substrate 103 as shown in FIG. 7. Component-embedded resin substrate 103 is in a polygonal line shape when viewed in a planar view.

Figure 8:
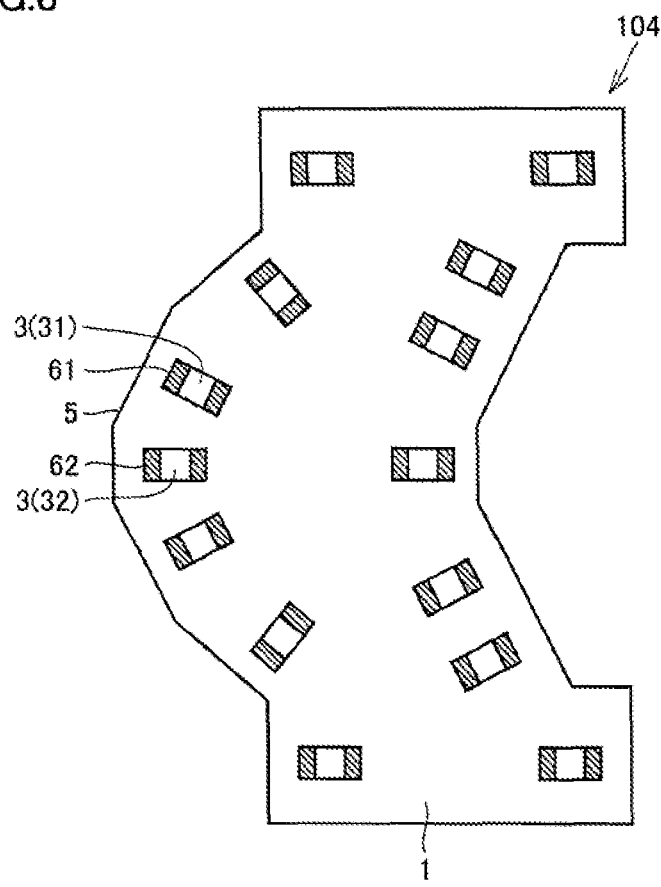
FIG. 8 is a plan view of a second variation of the component-embedded resin substrate in the first embodiment based on the present invention.

A component-embedded resin substrate to which the present invention is applied may be constructed like a component-embedded resin substrate 104 shown in FIG. 8. Component-embedded resin substrate 104 includes a concavely curved portion and a convexly curved portion when viewed in a planar view. The concavely curved portion and the convexly curved portion may be in an arc shape, and here, a radius of curvature of both of these may not be the same.

Figure 9:
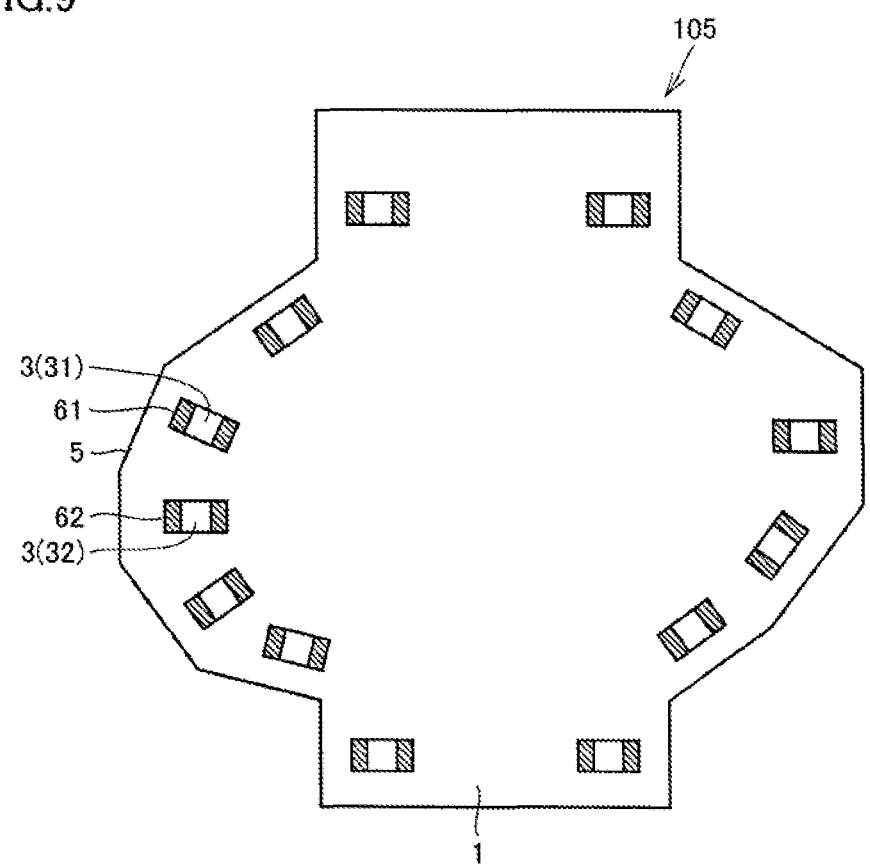
FIG. 9 is a plan view of a third variation of the component-embedded resin substrate in the first embodiment based on the present invention.

A component-embedded resin substrate to which the present invention is applied may be constructed like a component-embedded resin substrate 105 shown in FIG. 9. Component-embedded resin substrate 105 has a plurality of convexly curved portions when viewed in a planar view. Each curved portion extends in an irregular curve, instead of an arc.

Figure 10:
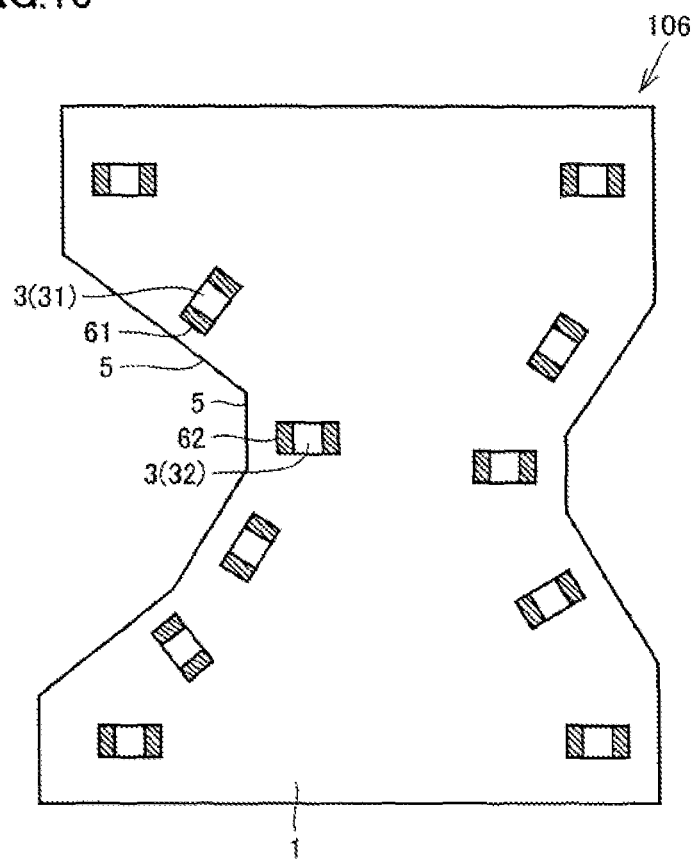
FIG. 10 is a plan view of a fourth variation of the component-embedded resin substrate in the first embodiment based on the present invention.

A component-embedded resin substrate to which the present invention is applied may be constructed like a component-embedded resin substrate 106 shown in FIG. 10. Component-embedded resin substrate 106 has a plurality of concavely curved portions when viewed in a planar view.

Figure 11:
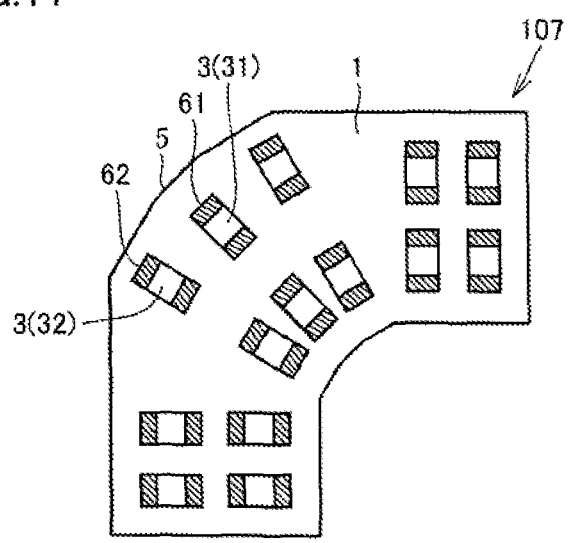
FIG. 11 is a plan view of a fifth variation of the component-embedded resin substrate in the first embodiment based on the present invention.

A component-embedded resin substrate to which the present invention is applied may be constructed like a component-embedded resin substrate 107 shown in FIG. 11. Component-embedded resin substrate 107 is generally in an L shape. In a bent portion, a plurality of embedded components 3 are aligned such that a longitudinal direction of embedded component 3 matches with a direction of radius. Consequently, in the bent portion, embedded components 3 are arranged such that a short side of each embedded component 3 extends along an outer geometrical line of component-embedded resin substrate 107. Though the outer geometrical line of the bent portion is a polygonal line in the example shown in FIG. 11, it may be a curved line instead of a polygonal line.

Figure 12:
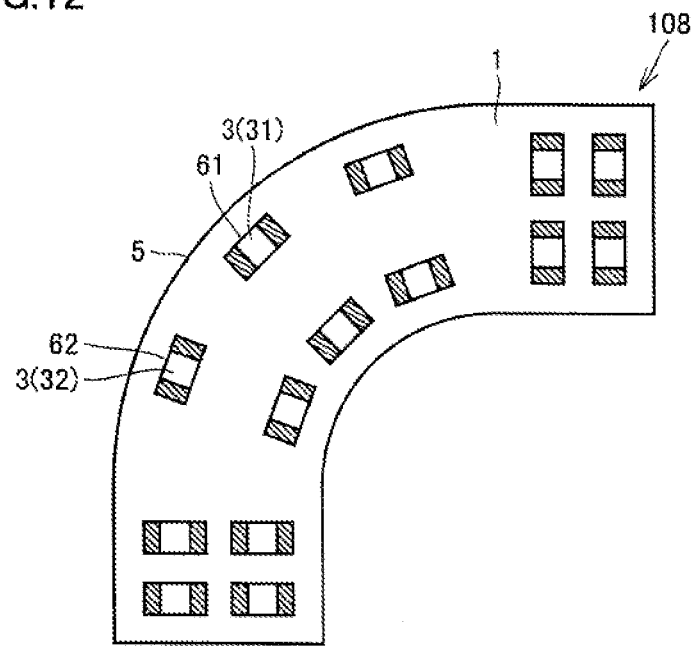
FIG. 12 is a plan view of a sixth variation of the component-embedded resin substrate in the first embodiment based on the present invention.

A component-embedded resin substrate to which the present invention is applied may be constructed like a component-embedded resin substrate 108 shown in FIG. 12. Component-embedded resin substrate 108 is generally in an L shape. In a bent portion, a plurality of embedded components 3 are aligned such that a longitudinal direction of embedded component 3 is orthogonal to a direction of radius. Consequently, in the bent portion, embedded components 3 are arranged such that a long side of each embedded component 3 extends along an outer geometrical line of component-embedded resin substrate 108. Though the outer geometrical line of the bent portion is a curve in the example shown in FIG. 12, it may be a polygonal line instead of a curved line.

(Second Embodiment)

Figure 13:
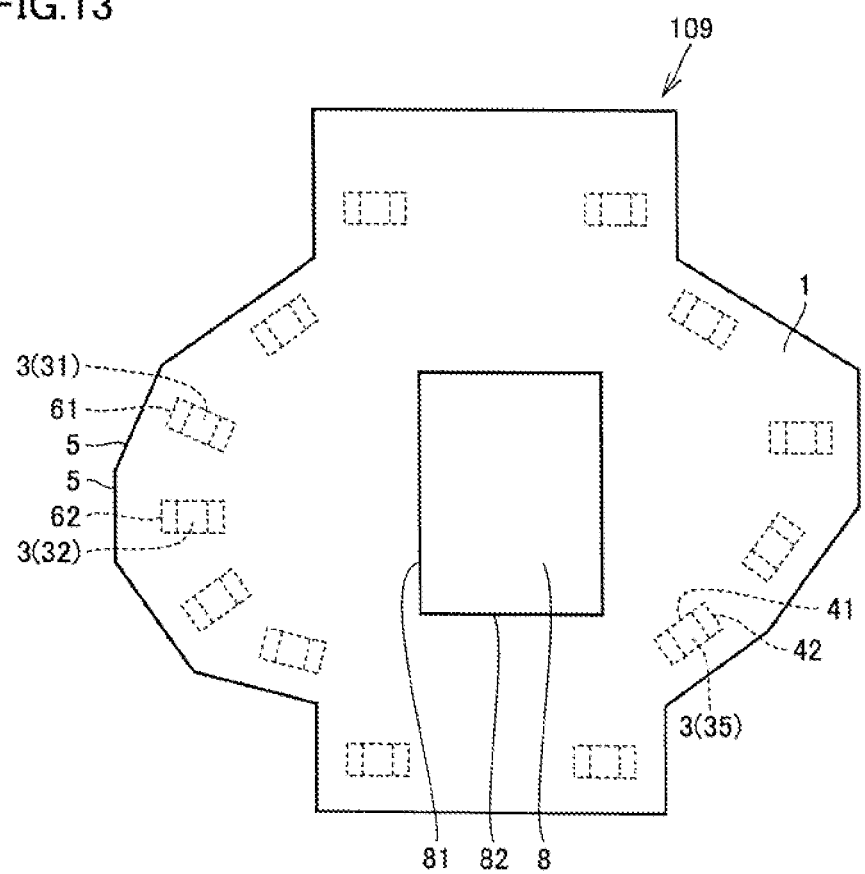
FIG. 13 is a plan view of a component-embedded resin substrate in a second embodiment based on the present invention.

A component-embedded resin substrate in a second embodiment based on the present invention will be described with reference to FIG. 13. FIG. 13 shows with a dashed line, embedded component 3 arranged as hidden in resin structure 1, as it is seen through. Since a surface mount component 8 is arranged on the surface of resin structure 1, it is shown with a solid line. A component-embedded resin substrate 109 in the present embodiment includes the features described in the first embodiment and further additionally includes features below. Component-embedded resin substrate 109 in the present embodiment includes one or more surface mount components 8 placed on the surface of resin structure 1 and having a rectangular shape with a long side 81 and a short side 82 when viewed in a planar view. Embedded component 3 located at a position closest to surface mount component 8 when viewed in a steric view is defined as a "closest embedded component" 35. Closest embedded component 35 is in a rectangular shape having a long side 41 and a short side 42 when viewed in a planar view. When viewed in a planar view, long side 41 of closest embedded component 35 extends in a direction different from long side 81 of surface mount component 8. Surface mount component 8 is, for example, an IC (Integrated Circuit). In the example shown in FIG. 13, there is no embedded component 3 within a projection area of surface mount component 8, and one embedded component 3 in a lower right portion in the figure is closest embedded component 35.

In the example shown in FIG. 13, there is only a single surface mount component 8. Therefore, embedded component 3 closest to this single surface mount component 8 when viewed in a steric view was described as closest embedded component 35. When there are two or more surface mount components 8, a condition should only be satisfied with regard to at least one surface mount component 8 among them.

Figure 14:
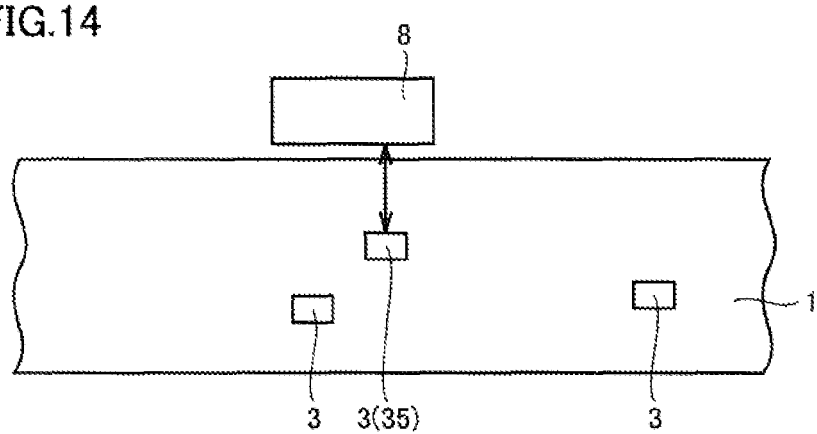
FIG. 14 is a first diagram illustrating a method of determining a closest embedded component.

It is noted that, in determining a closest embedded component, embedded component 3 closest to surface mount component 8 is selected and this embedded component is defined as closest embedded component 35, in consideration of three-dimensional positional relation. A distance between surface mount component 8 and embedded component 3 means a distance between the closest points, rather than a distance between the centers or the like. If it is assumed that surface mount component 8 and all embedded components 3 are arranged in the same cross-section, they may be illustrated as in FIG. 14. When three embedded components 3 are present in resin structure 1, embedded component 3 second from the left in FIG. 14 is embedded component 3 located at a position closest to surface mount component 8, and it is defined as closest embedded component 35. In this case, though a plurality of embedded components 3 are present within a projection area of surface mount component 8, embedded component 3 at a position closest to surface mount component 8, that is, embedded component 3 at the shallowest position, is defined as closest embedded component 35.

Figure 15:
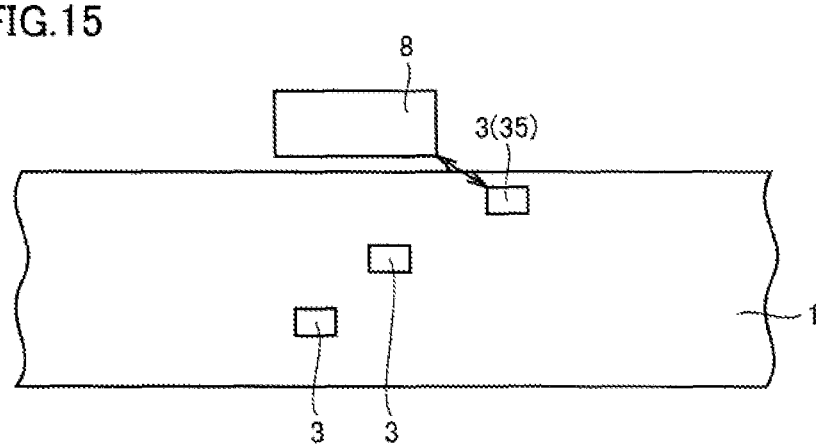
FIG. 15 is a second diagram illustrating a method of determining a closest embedded component.

Even when one or more embedded components 3 are present within a projection area of surface mount component 8 as in the example shown in FIG. 15, it is possible that embedded component 3 out of the projection area is closer to surface mount component 8. In that case, embedded component 3 located at a closest position when viewed in a steric view is defined as closest embedded component 35 even though it is outside the projection area of surface mount component 8.

Figure 16:
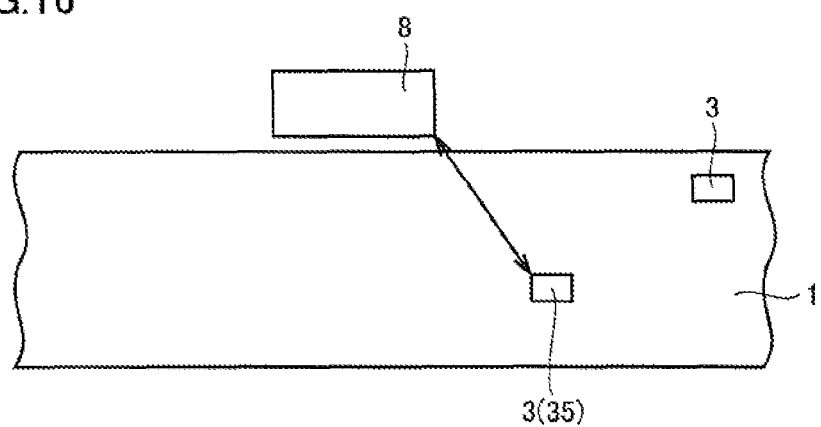
FIG. 16 is a third diagram illustrating a method of determining a closest embedded component.

In a case that there is no embedded component 3 within a projection area of surface mount component 8 as in the example shown in FIG. 16 as well, embedded component 3 located at a closest position when viewed in a steric view is defined as closest embedded component 35.

Figure 17:
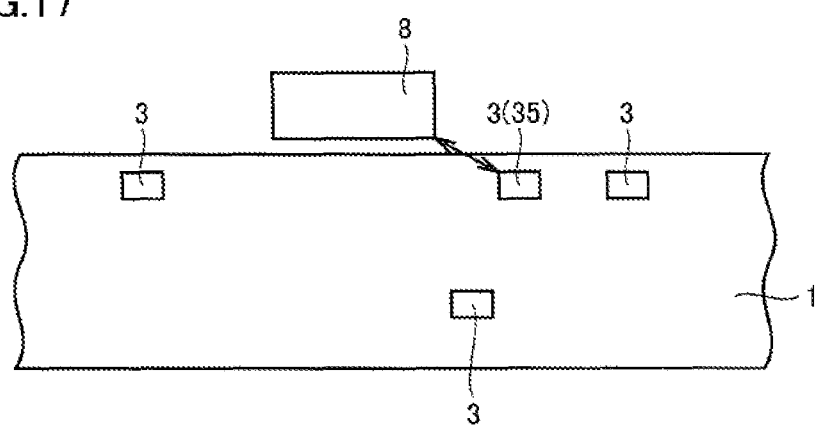
FIG. 17 is a fourth diagram illustrating a method of determining a closest embedded component.

Similarly, in the example shown in FIG. 17 as well, embedded component 3 located at a closest position when viewed in steric view is defined as closest embedded component 35.

In FIGS. 14 to 17, for the sake of convenience of illustration, description has been given assuming that surface mount component 8 and all embedded components 3 are located in the same cross-section. Actually, however, a positional relation in a three-dimensional space should be considered in order to determine which one of embedded components 3 is closest to surface mount component 8.

In the present embodiment, in addition to the effect described in the first embodiment, the following effect can be obtained. In component-embedded resin substrate 109 in the present embodiment (see FIG. 13), when viewed in a planar view, long side 41 of closest embedded component 35 extends in a direction different from long side 81 of surface mount component 8. Therefore, interference of characteristics between an embedded component and a surface mount component can be suppressed.

It is noted that, in the present embodiment, long side 41 of closest embedded component 35 is preferably oblique to long side 81 of surface mount component 8 when viewed in a planar view. This is because these sides being oblique to each other as such facilitate prevention of interference of characteristics.

Though surface mount component 8 has been described as being greater than embedded component 3, a surface mount component is not necessarily greater than an embedded component. A surface mount component may be smaller than an embedded component, or a surface mount component may be a component substantially similar in size to an embedded component.

(Example Including a Plurality of Surface Mount Components)

Figure 18:
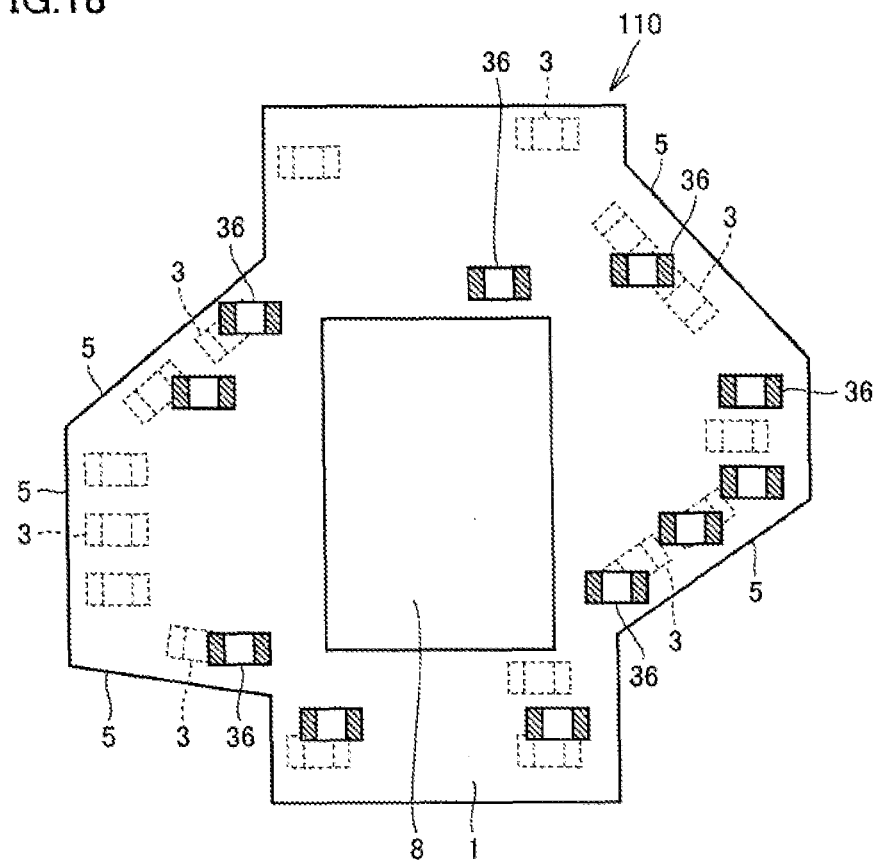
FIG. 18 is a plan view of a variation of a component-embedded resin substrate in the second embodiment based on the present invention.
Figure 19:
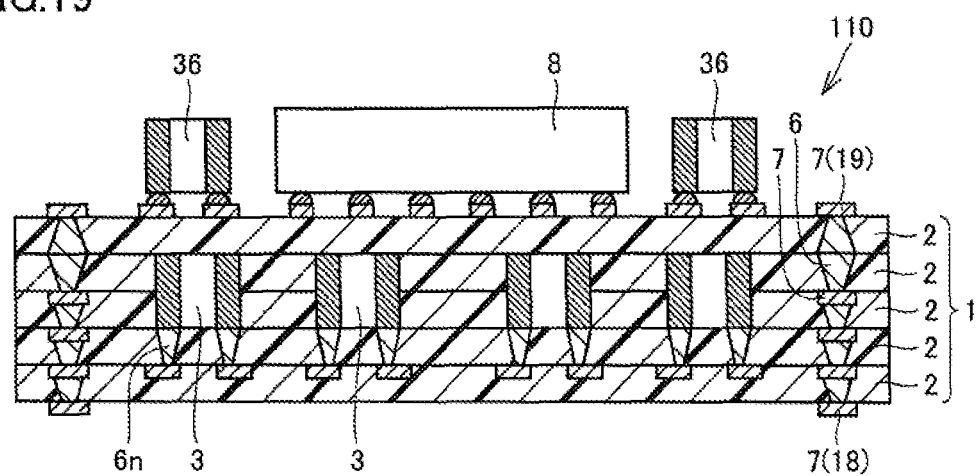
FIG. 19 is a schematic cross-sectional view of the variation of the component-embedded resin substrate in the second embodiment based on the present invention.

In a case that a component-embedded resin substrate includes a surface mount component, it is not always the case that a plurality of surface mount components of the same type are arranged. Surface mount components different in size and shape may be arranged as mixed on a surface of one component-embedded resin substrate. For example, like a component-embedded resin substrate 110 shown in FIG. 18, such a construction that one or more embedded components 3 are arranged in resin structure 1 and one or more surface mount components 36 are arranged on a surface of resin structure 1 in addition to surface mount component 8 is also possible. In FIG. 18, surface mount components 8, 36 located on the surface are shown with a solid line and embedded components 3 hidden in the inside are shown with a dashed line. Surface mount component 36 located on the surface of resin structure 1 is arranged in parallel to surface mount component 8, and embedded component 3 arranged inside is arranged in parallel to end surface 5 of resin structure 1. FIG. 19 shows a schematic cross-sectional view. Though longitudinal directions of embedded component 3 and surface mount components 8, 36 are all shown to be in parallel to the sheet surface in FIG. 19, it is shown as such merely because of limitation of representation, and actually, longitudinal directions of all components are not necessarily the same. In a case of a construction including a plurality of surface mount components like component-embedded resin substrate 110, an embedded component closest to each of the plurality of surface mount components should be assumed and then positional relation should be considered. As shown in FIG. 18, embedded component 3 corresponding to a closest embedded component is oblique to at least some of surface mount components 36. "Oblique" herein means long sides of components are in relation oblique to each other based on comparison thereof. This oblique positional relation is attributed to the fact that surface mount component 36 is arranged in parallel to surface mount component 8 and embedded component 3 corresponding to a closest embedded component is arranged in parallel to end surface 5 of resin structure 1. With such a construction, interference of characteristics between surface mount component 36 arranged on the surface and embedded component 3 arranged inside tends to be avoided.

(Manufacturing Method)

Figure 20:
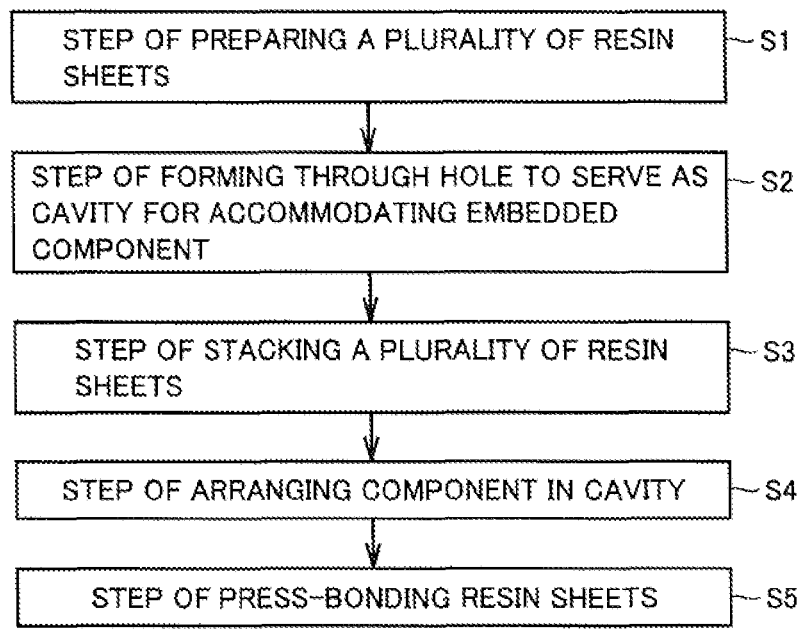
FIG. 20 is a flowchart of a method of manufacturing a component-embedded resin substrate based on the present invention.

A method of manufacturing a component-embedded resin substrate based on the present invention will be described in detail with reference to the drawings. FIG. 20 shows a flowchart of this method of manufacturing a component-embedded resin substrate.

Figure 21:
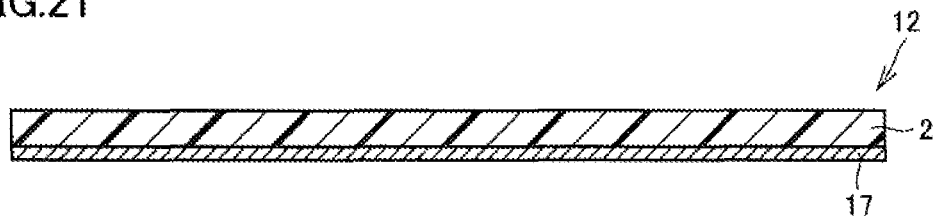
FIG. 21 is a diagram illustrating a first step of the method of manufacturing a component-embedded resin substrate based on the present invention.

Initially, as a step S1, a resin sheet with conductor foil 12 as shown in FIG. 21 is prepared. Resin sheet with conductor foil 12 is a sheet having such a structure that a conductor foil 17 is attached to one surface of resin layer 2. Resin layer 2 is composed, for example, of LCP (liquid crystal polymer) which is a thermoplastic resin. In addition to LCP, materials for resin layer 2 may include PEEK (polyether ether ketone), PEI (polyether imide), PPS (polyphenylene sulfide), PI (polyimide), and the like. Conductor foil 17 is a foil having a thickness of 18 μm and composed, for example, of Cu. It is noted that, other than Cu, materials for conductor foil 17 may include Ag, Al, SUS, Ni, Au, and alloys of two or more different metals selected from these metals. Though conductor foil 17 has a thickness of 18 μm in the present embodiment, conductor foil 17 may have a thickness approximately from at least 3 μm to at most 40 μm. Conductor foil 17 should only have such a thickness that is capable of forming a circuit.

"Preparing a plurality of resin sheets" in step S1 means preparing a plurality of resin sheets with conductor foil 12, or preparing a resin sheet 12 with a single conductor foil that should subsequently be cut individually into a plurality of resin sheets.

Figure 22:
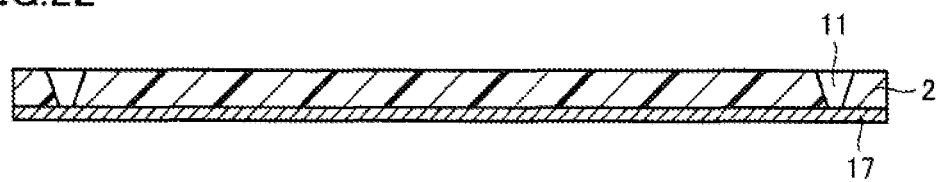
FIG. 22 is a diagram illustrating a second step of the method of manufacturing a component-embedded resin substrate based on the present invention.

Then, as shown in FIG. 22, a via hole 11 is formed to penetrate resin layer 2, by irradiating a surface on the resin layer 2 side of resin sheet with conductor foil 12 with carbon dioxide laser beams. Though via hole 11 penetrates resin layer 2, it does not penetrate conductor foil 17. Thereafter, smear (not shown) in via hole 11 is removed. Though carbon dioxide laser beams have been used for forming via hole 11 here, laser beams of other types may be used. Alternatively, in order to form via hole 11, a method other than irradiation with laser beams may be adopted.

Figure 23:
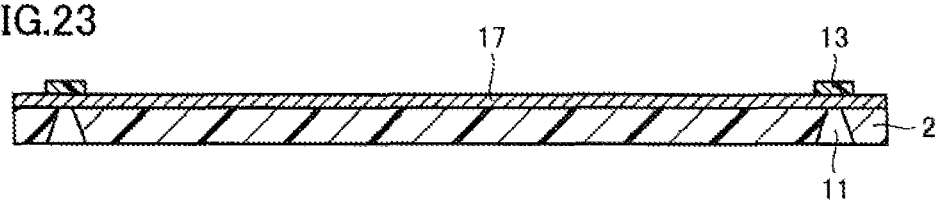
FIG. 23 is a diagram illustrating a third step of the method of manufacturing a component-embedded resin substrate based on the present invention.

Then, as shown in FIG. 23, a resist pattern 13 corresponding to a desired circuit pattern is printed on a surface of conductor foil 17 of resin sheet with conductor foil 12, with such a method as hole embedment with paste.

Figure 24:
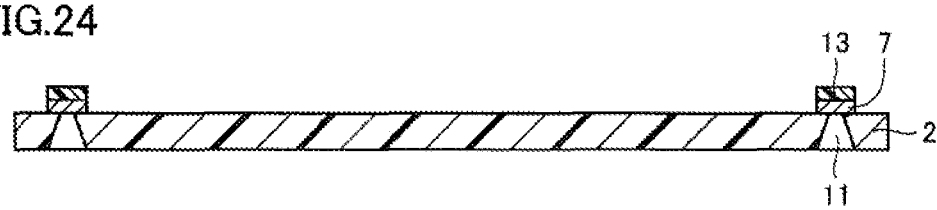
FIG. 24 is a diagram illustrating a fourth step of the method of manufacturing a component-embedded resin substrate based on the present invention.
Figure 25:
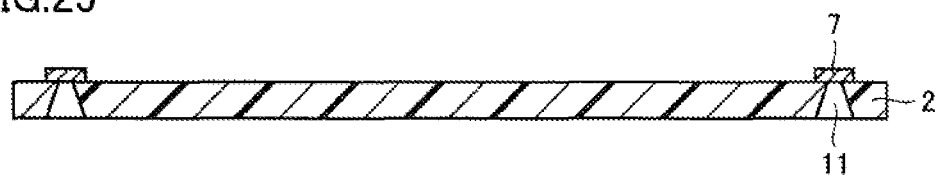
FIG. 25 is a diagram illustrating a fifth step of the method of manufacturing a component-embedded resin substrate based on the present invention.

Then, etching is performed with resist pattern 13 serving as a mask, and a portion of conductor foil 17 not covered with resist pattern 13 is removed as shown in FIG. 24. A portion of conductor foil 17 which remained after this etching is referred to as "conductor pattern 7". Thereafter, as shown in FIG. 25, resist pattern 13 is removed. Thus, desired conductor pattern 7 is obtained on one surface of resin layer 2.

Figure 26:
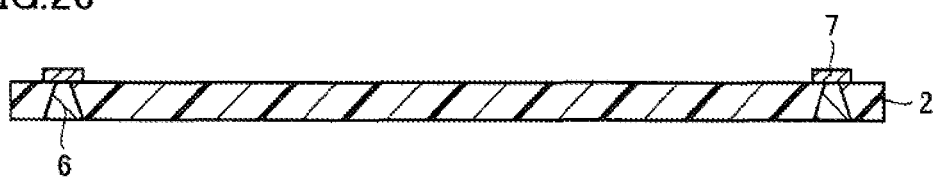
FIG. 26 is a diagram illustrating a sixth step of the method of manufacturing a component-embedded resin substrate based on the present invention.

Then, as shown in FIG. 26, via hole 11 is filled with a conductive paste by hole embedment with paste. Hole embedment with paste is carried out from a surface on a lower side in FIG. 25. Though FIGS. 25 and 26 show via hole 11 in a position facing downward for the sake of convenience of illustration, actually, hole embedment with paste may suitably be carried out at a different position. Though a conductive paste for filling may be composed mainly of silver as described above, it may be composed mainly, for example, of copper instead. This conductive paste preferably contains an appropriate amount of such metal powders as forming an alloy layer between the conductive paste and a metal which is a material for conductor pattern 7 at a temperature for subsequent thermocompression of stacked resin layers (hereinafter referred to as a "thermocompression temperature"). Since this conductive paste contains copper, that is, Cu, as a main component for exhibiting conductivity, this conductive paste preferably contains at least one of Ag, Cu, and Ni and at least one of Sn, Bi, and Zn, in addition to the main component. Via conductor 6 is thus formed.

Figure 27:
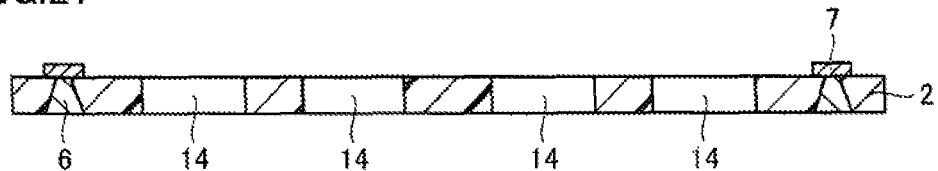
FIG. 27 is a diagram illustrating a seventh step of the method of manufacturing a component-embedded resin substrate based on the present invention.

Then, as a step S2, as shown in FIG. 27, a through hole 14 having an area greater than a projection area of component 3 is formed by punching resin layer 2. The plurality of resin layers 2 to be laminated include those in which through hole 14 is formed and those in which no through hole 14 is formed. Among the plurality of resin layers 2, in accordance with design, through hole 14 is formed only in resin layers 2 in which through hole 14 is to be formed. Though FIG. 27 shows that four through holes 14 are formed by way of example, this is merely an example and the number of through holes 14 is not limited to four.

Figure 28:
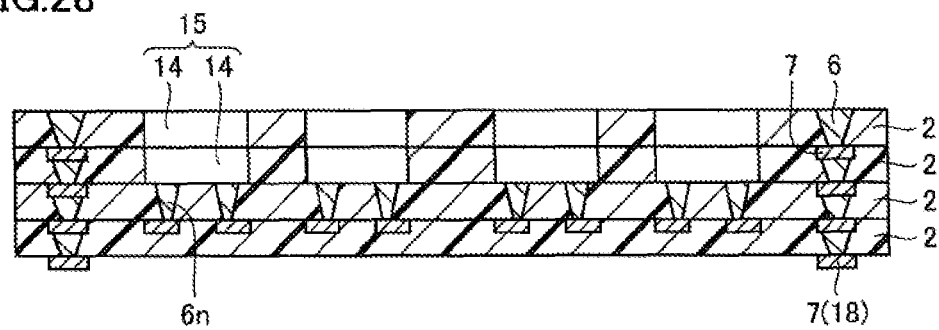
FIG. 28 is a diagram illustrating an eighth step of the method of manufacturing a component-embedded resin substrate based on the present invention.

As a step S3, as shown in FIG. 28, a plurality of resin layers 2 are stacked to form a substrate. In a lowermost layer of the substrate, resin layer 2 is arranged so that a surface of resin layer 2 on which conductor pattern 7 is formed faces downward so as to arrange conductor pattern 7 on the lower surface of the substrate. Thus, conductor pattern 7 arranged on the lower surface of the substrate serves as an external electrode 18. In the vicinity of the lower surface of the substrate, resin layer 2 in which no through hole 14 is formed is employed.

After one resin layer 2 or two or more resin layers 2 in which no through hole 14 is formed is/are stacked, resin layer 2 in which through hole 14 has been formed is stacked. In the example shown in FIG. 28, after two resin layers 2 in which no through hole 14 is formed are arranged, two resin layers 2 in which through hole 14 has been formed are layered. With the combination of through holes 14 in two or more layers, a component accommodation portion 15 as a cavity is formed. Component accommodation portion 15 is a recess portion having such a depth that is capable of accommodating component 3.

As shown in FIG. 28, at the time point when resin layers 2 are stacked sufficient to form component accommodation portion 15, provisional press-bonding is carried out at a temperature lower than a thermocompression temperature. A temperature for provisional press-bonding is, for example, not lower than 150° C. and not higher than 200° C. By provisional press-bonding, resin layers 2 stacked by this time point are connected and component accommodation portion 15 is formed as a stable recess portion. Provisional press-bonding may be carried out each time one resin layer is stacked.

Figure 29:
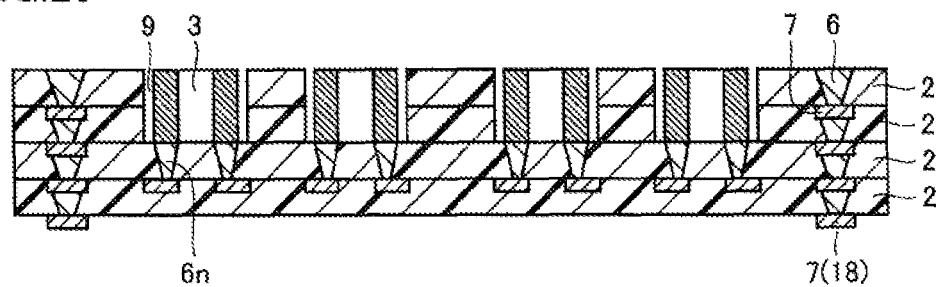
FIG. 29 is a diagram illustrating a ninth step of the method of manufacturing a component-embedded resin substrate based on the present invention.
Figure 32:
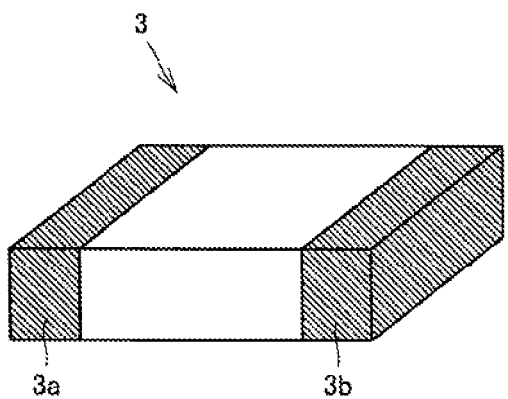
FIG. 32 is a perspective view of an embedded component based on the conventional art.
Figure 33:
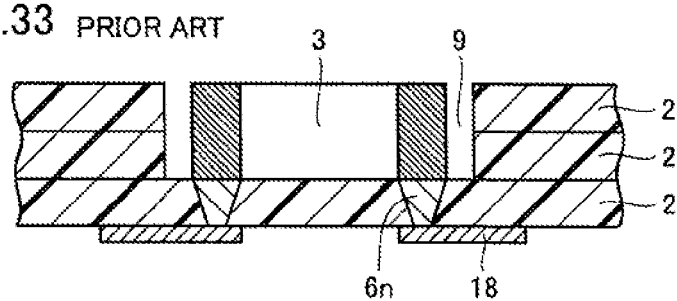
FIG. 33 is a cross-sectional view in a state that an embedded component is arranged in a recess portion formed in a stack of resin layers in an intermediate stage of manufacturing of a component-embedded resin substrate based on the conventional art.
Figure 34:
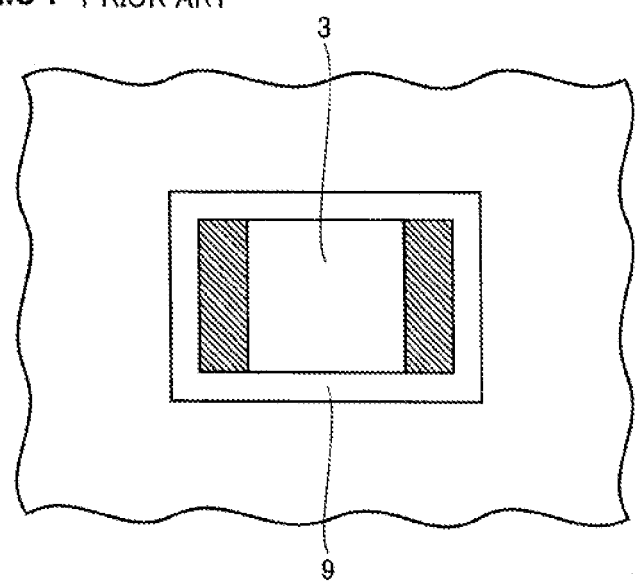
FIG. 34 is a plan view in a state that the embedded component is arranged in the recess portion formed in the stack of resin layers in the intermediate stage of manufacturing of a component-embedded resin substrate based on the conventional art.

As a step S4, as shown in FIG. 29, embedded component 3 is arranged in component accommodation portion 15. In the example shown here, embedded component 3 is in a parallelepiped shape. Though embedded component 3 has electrodes 3a, 3b at respective opposing ends in the longitudinal direction as shown in FIG. 32, a shape or a structure of embedded component 3 is not limited as such.

Figure 30:
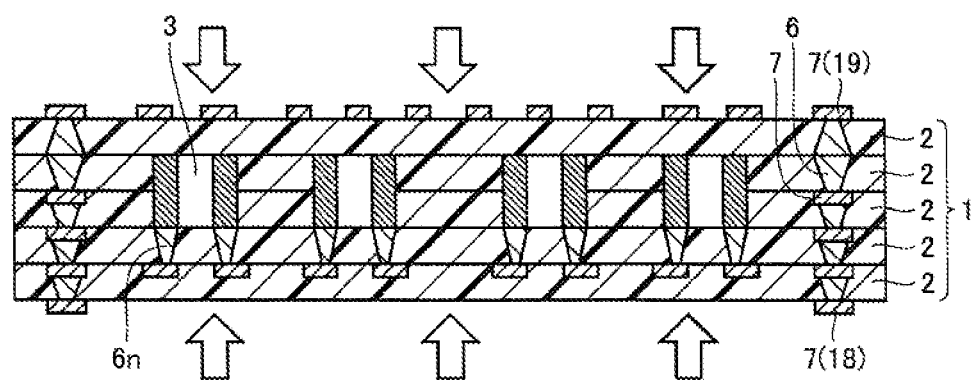
FIG. 30 is a diagram illustrating a tenth step of the method of manufacturing a component-embedded resin substrate based on the present invention.
Figure 31:
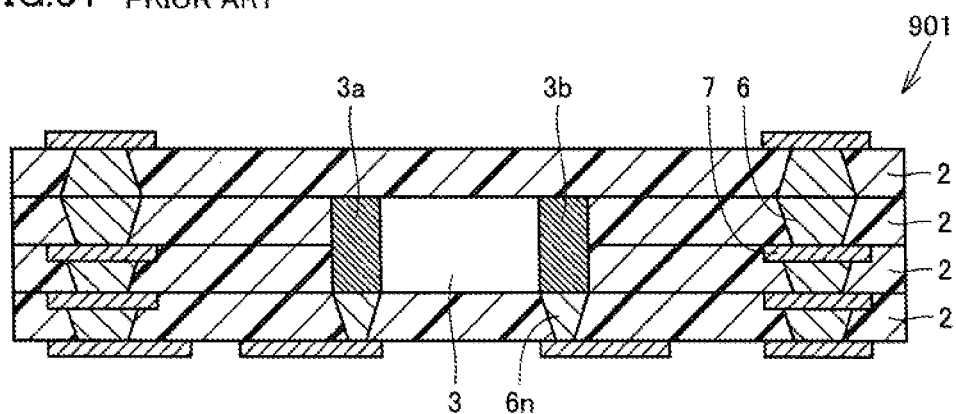
FIG. 31 is a cross-sectional view of a component-embedded resin substrate based on the conventional art.

Then, as shown in FIG. 30, resin layer 2 is further arranged on embedded component 3. This resin layer 2 does not have through hole 14. Conductor pattern 7 formed on resin layer 2 located at an uppermost layer of the substrate serves as an external electrode 19 for mounting other IC components or the like. In the example shown in FIG. 30, though one resin layer 2 is layered as compared with FIG. 29, two or more resin layers may be layered, without being limited to one layer.

Then, as a step S5, this stack is fully press-bonded. In the step of full press-bonding, the stack already provisionally press-bonded and resin layer 2 stacked after provisional press-bonding are together subjected to thermocompression in their entirety. A temperature for full press-bonding is, for example, not lower than 250° C. and not higher than 300° C. The "thermocompression temperature" described above means this temperature of full press-bonding. With full press-bonding, resin layers 2 adjacent in a direction of thickness adhere to each other and an integrated insulating base material is formed. In a case that a thermoplastic resin is employed as a material for resin layer 2, a material for resin layer 2 is softened and fluidized through thermocompression. Therefore, gap 9 is filled with a fluidized material for resin layer 2 therearound. An integrated member obtained from the stack of resin layer 2 through full press-bonding is also called resin structure 1. After full press-bonding is completed, the respective surfaces of external electrodes 18, 19 formed on the upper surface and the lower surface of the component-embedded resin substrate are preferably plated with Ni, Au, or the like.

In addition, surface mount components 8, 36 are mounted on the upper surface of resin structure 1. Component-embedded resin substrate 110 is thus obtained as shown in FIG. 19. Since FIG. 19 is a cross-sectional view, it appears that four embedded components 3 are simply aligned. When viewed in a plan view, however, they are disposed in positional relation as shown in FIG. 18.

The component-embedded resin substrates described in the embodiments so far can be obtained with a similar manufacturing method. In a case of attempting to manufacture a component-embedded resin substrate without a surface mount component in a final form, the final step of mounting a surface mount component should only be omitted.

It is noted that each of a plurality of embedded components 3 is preferably arranged to be in parallel to end surface 5 closest to embedded component 3 in the component-embedded resin substrate as shown in any of the embodiments described above. With such a construction, occurrence of what is called θ rotation or position displacement of an embedded component in the press-bonding step can be suppressed in all of the plurality of embedded components 3 contained in a component-embedded resin substrate which is a substrate of variant shape.

In the embodiments above disclosed herein, embedded component 3 is in a parallelepiped shape and electrodes of embedded component 3 are provided at respective opposing end portions of the parallelepiped, however, a shape of an electrode is not limited as such. A plurality of electrodes may be provided as in an LGA (Land Grid Array) or an IC.

It should be noted that the above embodiments disclosed herein are illustrative and non-restrictive in every respect. The scope of the present invention is defined by the terms of the claims, rather than the description above, and is intended to include any modifications within the scope and meaning equivalent to the terms of the claims.

The present invention can be made use of for a component-embedded resin substrate.

1 resin structure; 2 resin layer; 3 embedded component; 3a, 3b electrode; 5 end surface; 6, 6n via conductor; 7 conductor pattern; 8, 36 surface mount component; 11 via hole; 12 resin sheet with conductor foil; 13 resist pattern; 14 through hole; 15 component accommodation portion; 17 conductor foil; 18 external electrode; 31 first embedded component; 32 second embedded component; 35 closest embedded component; 41 long side (of closest embedded component); 42 short side (of closest embedded component); 61 first outer side; 62 second outer side; 81 long side (of surface mount component); 82 short side (of surface mount component); 101, 102, 103, 104, 105, 106, 107, 108, 109 component-embedded resin substrate; and 901 (conventional) component-embedded resin substrate.

The invention claimed is:

1. A component-embedded resin substrate, comprising:
a resin structure including a plurality of laminated resin layers and having an end surface surrounding an outer periphery of said resin layers; and
a plurality of embedded components arranged as embedded in said resin structure,
said plurality of embedded components including a first embedded component and a second embedded component,
said first embedded component having a first outer side extending along a first portion of said end surface closest to said first embedded component when viewed in a planar view,
said second embedded component having a second outer side extending along a second portion of said end surface closest to said second embedded component when viewed in a planar view,
said first outer side being oblique to said second outer side when viewed in a planar view,
said resin structure having an irregular shape when viewed in a planar view, and
said first portion of said end surface being oblique to said second portion of said end surface,
wherein each of said plurality of embedded components is arranged in parallel to said end surface closest to said embedded component, and
wherein said end surface closest to said first embedded component has a straight portion not shorter than said first outer side, and said end surface closest to said second embedded component has a straight portion not shorter than said second outer side.

2. The component-embedded resin substrate according to claim 1, wherein
said first embedded component and said second embedded component are each in a rectangular shape having a long side and a short side when viewed in a planar view, said first outer side is a short side of said first embedded component, and said second outer side is a short side of said second embedded component.

3. The component-embedded resin substrate according to claim 1, further comprising one or more surface mount components placed on a surface of said resin structure and having a rectangular shape with a long side and a short side when viewed in a planar view, wherein
an embedded component of said plurality of embedded components having a shortest three-dimensional distance to at least a portion of said surface mount component is defined as a closest embedded component, said closest embedded component is in a rectangular shape having a long side and a short side when viewed in a planar view, and a long side of said closest embedded component extends in a direction different from a long side of said surface mount component when viewed in a planar view.

4. The component-embedded resin substrate according to claim 3,
wherein the long side of said closest embedded component is oblique to the long side of said surface mount component when viewed in a planar view.

* * * * *